United States Patent [19]
Gerster et al.

[11] Patent Number: 5,566,063
[45] Date of Patent: Oct. 15, 1996

[54] ELECTRONIC POWER CONVERTER CIRCUIT ARRANGEMENT AND METHOD FOR DRIVING SAME

[75] Inventors: Christian Gerster; Reto Schöb, both of Zürich, Switzerland

[73] Assignee: ABB Management AG, Baden, Switzerland

[21] Appl. No.: 326,961

[22] Filed: Oct. 21, 1994

[30] Foreign Application Priority Data

Oct. 21, 1993 [DE] Germany .......................... 43 35 857.8

[51] Int. Cl.⁶ .......................... H02M 3/24; H02M 7/44; H02M 1/12; H02M 1/14
[52] U.S. Cl. .......................... 363/98; 363/41
[58] Field of Search .......................... 363/42, 43, 56, 363/37, 54, 98

[56] References Cited

U.S. PATENT DOCUMENTS

| | | | |
|---|---|---|---|
| 3,715,649 | 2/1973 | Ravas .......................... | 321/45 |
| 4,084,221 | 4/1978 | Ogata . | |
| 4,628,475 | 12/1986 | Azusawa et al. .......................... | 364/851 |
| 4,641,075 | 2/1987 | Asano et al. .......................... | 318/811 |
| 5,032,968 | 6/1991 | Mikami et al. .......................... | 363/37 |
| 5,123,746 | 6/1992 | Okado .......................... | 363/37 |
| 5,155,673 | 10/1992 | Takahashi et al. . | |
| 5,216,588 | 6/1993 | Bajwa et al . | |

*Primary Examiner*—Peter S. Wong
*Assistant Examiner*—Bao Q. Vu
*Attorney, Agent, or Firm*—Oblon, Spivak, McClelland, Maier & Neustadt, P.C.

[57] ABSTRACT

A method and a device for driving a series circuit of power semicondutor switches (2) are specified. In this case, the voltage loading of the individual switches of the series circuit is balanced by providing that the voltage (Uce1 ... Ucen) across each switch of the series circuit is measured as the controlled variable, and that this measured voltage is used to vary the switching instants in such a way that the voltage loading during switching is essentially equal for all the switches. In addition, the level of the control voltage (Ugeoff1 ... Ugeoffn) in the blocking state can be influenced with the aid of the measured voltage in such a way that the blocking voltages of the switches are essentially equal. The advantage of the invention is to be seen in that the voltage loading of the individual semiconductors can be balanced not only during switching, but also in the blocking state. In addition, the control also balances influences of parameter differences and parameter changes, as well as influences of the circuit. As a result, the switches can be optimally utilized in terms both of power and of frequency.

15 Claims, 6 Drawing Sheets

ELECTRONIC POWER CONVERTER CIRCUIT ARRANGEMENT AND METHOD FOR DRIVING SAME

BACKGROUND OF THE INVENTION

1. Field of the Invention

The invention relates to the field of power electronics.

It proceeds from a method for driving an electronic power converter circuit arrangement according to the preamble of the first claim. It relates, furthermore, to an electronic power converter circuit arrangement.

2. Discussion of Background

Such a method and an electronic power converter circuit arrangement have already been described, for example, in the article by A. Stamberger "Serie- oder parallelgeschaltete Hochleistungs- GTOs mit genau synchronisierter Abschaltung", ("Series- or parallel-connected high-power GTOs having a precisely synchronized turn off"), Elektroniker No. 3/1985, pages 68–72.

If the individual arms, for example, of a half-bridge contain series-connected power semiconductor switches (GTOs in the abovementioned article), this can lead to a bad, that is to say irregular voltage distribution. This can lead further to overloading of individual semiconductors of the series circuit. The reasons for this unequal loading reside in different turn-off times, differences in the parameters of the semiconductors and of the associated circuits, as well as parameter changes during operation.

In the above mentioned article, an attempt is made to balance the voltage loading of the individual switches by controlling the turn-off times of the control signals in such a way that all the GTOs of an electronic power converter arm start to block simultaneously. The instant of the turn-off signal is used as controlled variable.

However, only the turn-off time is exactly corrected thereby. Irregular voltage loadings due to parameter differences and parameter changes cannot be balanced, however, since it is not possible to provide any information on the exact voltage distribution. Moreover, the method previously explained acts only during switching, more precisely during turn-off. Differences in voltage loadings in the steady state of "blocking" still remain out of consideration, although these could occur because of parameter differences and parameter drift.

Consequently, the correction is incomplete and the utilization of the semiconductors is not optimal. In the case of applications in relatively large semiconductor modules (0.5 MVA switching capacity and more), this can have unfavorable effects.

SUMMARY OF THE INVENTION

Accordingly, one object of this invention is to provide a novel method for driving an electronic power converter circuit arrangement, and to provide an electronic power converter circuit arrangement in which the abovementioned disadvantages of the prior art are to be avoided. In particular, the control of the voltage distribution is also to take account of parameter differences and changes and is to come into play in the steady state.

This object is achieved in a method of the type mentioned at the beginning by means of the features of the first claim, and in a circuit arrangement of the type mentioned at the beginning by means of the features of the seventh claim.

The core of the method according to the invention is, thus, that the voltage across each switch of the series circuit is measured as the controlled variable and from this measured voltage the switching times are varied in such a way that during switching the voltage loadings become essentially equal for all the switches, and that the level of the control voltage is influenced in the blocking state with the aid of the measured voltage in such a way that the blocking voltages of the switches are essentially equal.

A preferred exemplary embodiment is distinguished in that in a specific switching operation one difference each is formed from the measured switch voltage and the nth (in the case of n switches connected in series) part of the total measured voltage across the series circuit, that an increase or decrease in the switching time delay for the next switching operation is calculated from this difference in the time between two switching operations, and that the switching times determined in this way are set in the switching operation following thereupon.

Upon turn-on, a lower voltage loading is obtained if turn-on is earlier, and a higher voltage loading is obtained in the case of a later turn-on. The behavior is exactly reversed in the case of turn-off.

In the steady, that is to say blocking state, the blocking current can be specifically increased by means of the level of the control signal, that is to say of the turn-off gate voltage, near the threshold voltage of the semiconductor. In this case, an increase in the blocking current produces a decrease in the blocking voltage. The voltage loading can be balanced using this method even in the blocking state.

Further exemplary embodiments of the method follow from the corresponding subclaims.

The core of the circuit arrangement according to the invention consists in that there are provided in the drive unit first means which measure a voltage across each switch, form a difference from the measured voltages and the nth part of the total voltage, and determine the turn-on and turn-off times of the control signals on each switch in such a way that all the switches are loaded equally in terms of voltage. In addition, second means are provided which set the level of the control signal in the blocking state from the calculated difference in such a way that an equal voltage loading results for all the switches.

These first and second means can be provided locally for each switch or centrally for all the switches together.

The advantage of the method according to the invention or of the circuit arrangement consists overall in that the voltage loading of the individual semiconductors can be balanced not only during turn-on and turn-off, but also in the blocking state. In addition, the control also balances influences of parameter differences and changes, as well as circuit influences. As a result, the switches can be utilized optimally in terms both of power and of frequency.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

FIG. 8 shows the principle of the balancing control during turn-on;

DESCRIPTION OF THE PREFERRED EMBODIMENTS

Figures 1A, 1B:
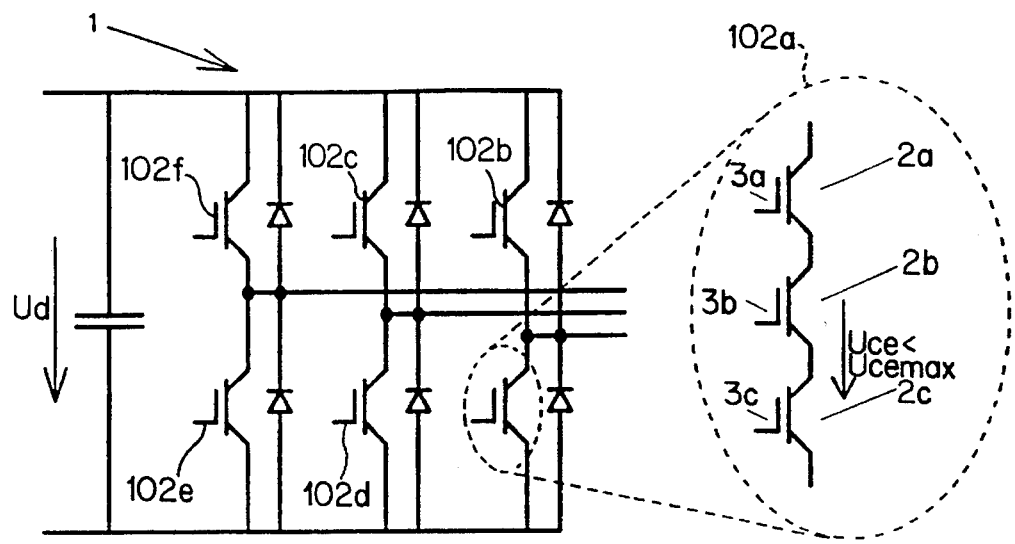
FIG. 1 shows an electronic power converter circuit arrangement having power semiconductors connected in series.

Referring now to the drawings, wherein like reference numerals designate identical or corresponding parts throughout the several views, it is shown in FIG. 1 how quick semiconductor switches ($2a$–$c$), for example such as the insulated gate bipolar transistor IGBT, can be connected in series to form switch $102a$ for any one of the switches $102a$–$f$; in order to increase the switchable voltage. Also shown in the FIG. 1 are the three respective gates $3a$–$3c$ for the switches $2a$–$c$. During the transient switching operations (turn-on and turn-off) and in the steadily blocked state (turned off) the entire voltage loading (Uce) is distributed irregularly over the individual semiconductors (2) because of natural parameter differences. This can lead to overloading of individual semiconductors, although the voltage loading should—for safe conditions—always be smaller than a maximal value (Ucemax).

Figure 6:
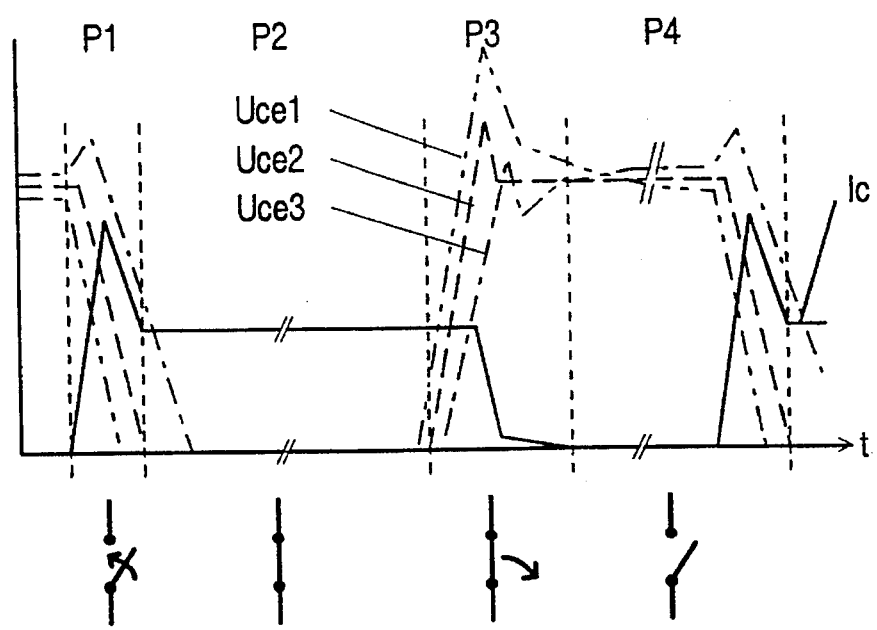
FIG. 6 shows the various phases, states and voltage loadings in the case of a switching operation of three switches.

The different voltages (Uce1, Uce2, Uce3) at three switches during the phases of turn-on (P1), conduction (P2), turn off (P3) and blocking (P4) are represented by way of example in FIG. 6.

It is chiefly inherent semiconductor properties such as, for example, differences with respect to storage charge and depletion layer capacitance, different delay times and turn-on and turn-off times which determine the voltage distribution transiently, that is to say during turn-on and turn-off (Phases P1 and P3). However, differences in driving due to signal propagation times affected by tolerance, jitter and drift, as well as properties in the load circuit (leakage inductances, leakage and earth capacitances and additional circuits) also have an influence which is not to be neglected.

In the turned-off state (P4), the voltage distribution is not stable, but depends on the preceding turn-off operation, the turned-off current and on the magnitude, tolerance and drift of the leakage current Ices as well as on a possibly present circuit. After a time depending on depletion layer and circuit capacitances, the leakage currents lead to an irregular steady-state voltage distribution in which in the most unfavorable case a single switch must absorb the entire blocking voltage.

An attempt has been made in the prior art to prevent this irregular loading by turning off all the semiconductor switches exactly at the same time. However, it is not necessarily ensured thereby that the voltage distribution is balanced over the switches, because the influences of parameter differences are not taken into account by this control.

Figure 2:
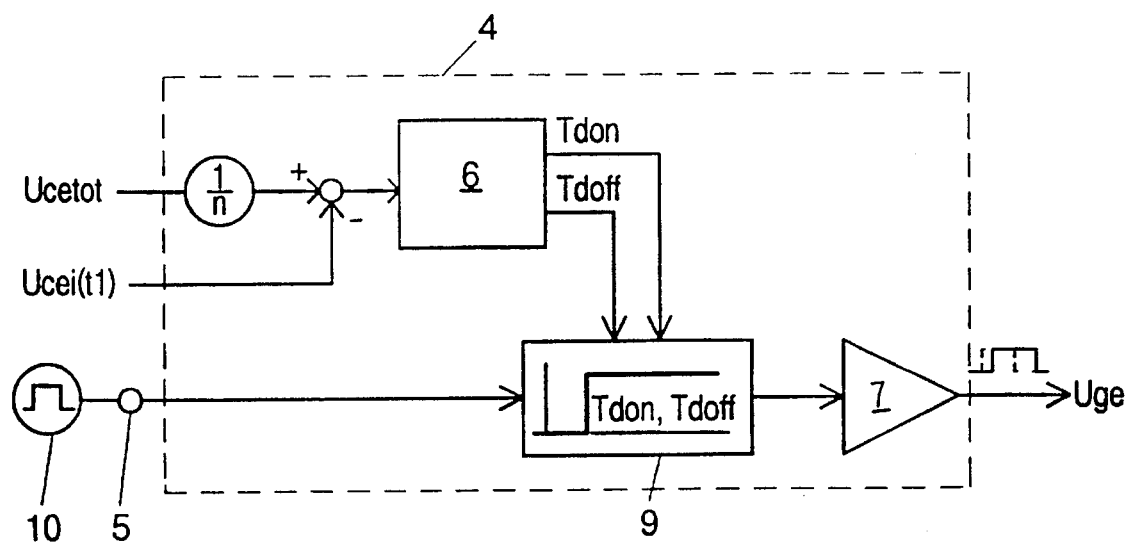
FIG. 2 shows the block diagram of a drive unit according to the invention for one switch, which balances the voltage loading of the switches during switching.
Figure 7:
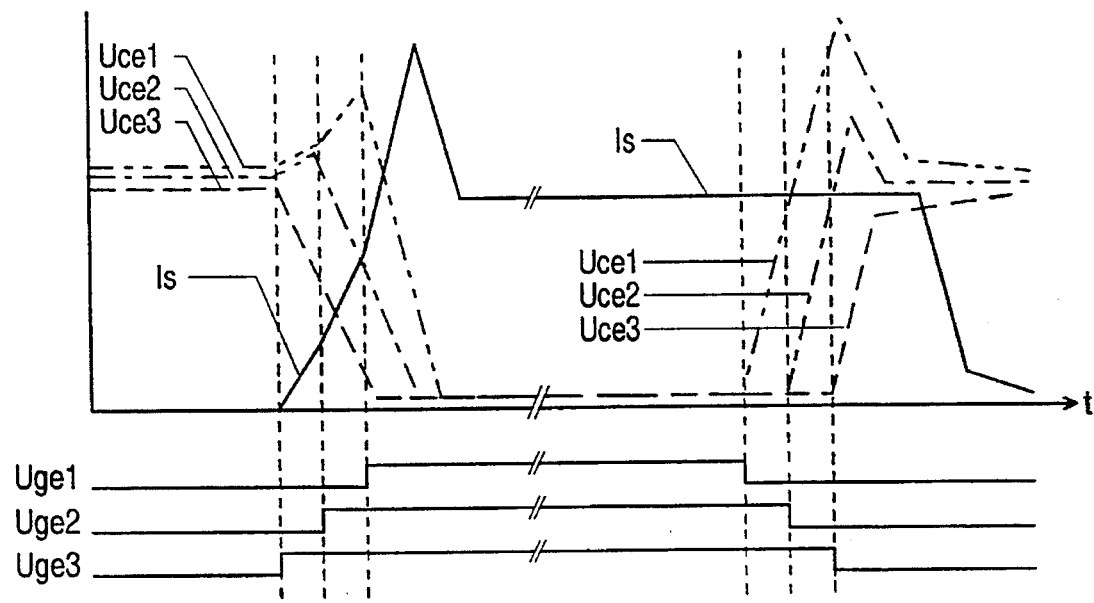
FIG. 7 shows a representation of how the voltages can be influenced via the switches by displacing the turn-on and turn-off times.

The invention sets out on a different approach. As FIG. 2 shows for turning on and off, a voltage (Uce1, Uce2 . . . Ucei . . . Ucen) is measured at each of the n, $n \geq 2$, switches (2) of a series circuit. The measured voltage is used to determine the switching instants (Tdon, Tdoff) of the control signals (Uge1 . . . Ugen) in such a way that during switching the voltage loading is essentially equal for all the switches (2). It is clear from FIG. 7 that during turn-on a higher voltage loading (Uce1) results from a delay in the turn-on point (for example, Uge1). A smaller voltage loading (Uce3) is obtained by an earlier turn-on (for example, Uge3). The behavior is exactly the reverse during turn-off: earlier turn-off (Uge1) produces a higher voltage loading (Uce1), while later turn-off (Uge3) produces a lower voltage loading (Uce3).

Figure 8:
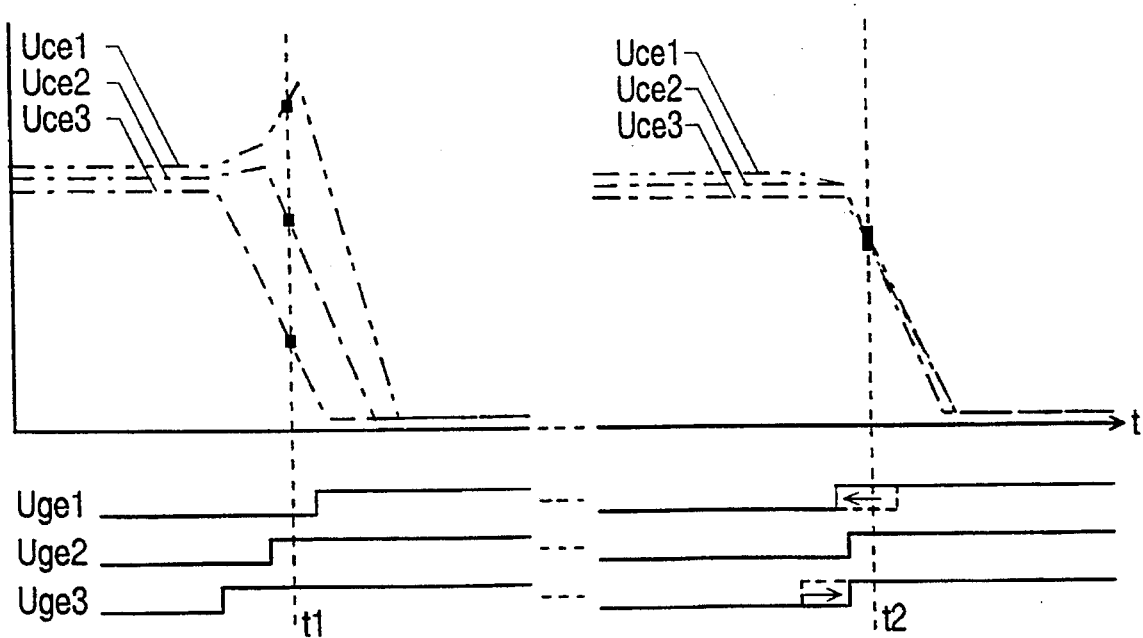

The control is performed in such a way that in a specific switching phase (P1 or P3) a difference (1/nUcetot - Ucei) is formed between the nth part of the total voltage (Ucetot) across the series circuit and the measured voltage (Uce1 . . . Ucen). If the difference is positive during turn-on, that is to say the voltage across the specific switch is too low, the relevant switch is turned on with a delay of a certain time during the next turn-on operation. If the difference is negative, turn-on is effected with a lead of a certain time. The time displacement is calculated anew for each turn-on operation, resulting finally in a uniform voltage distribution. As FIG. 8 clearly shows, this does not mean, however, that all the switches are thereby turned on at the same instant. Rather, they are turned on at the instant at which a uniform voltage distribution results for all the switches.

Figure 9:
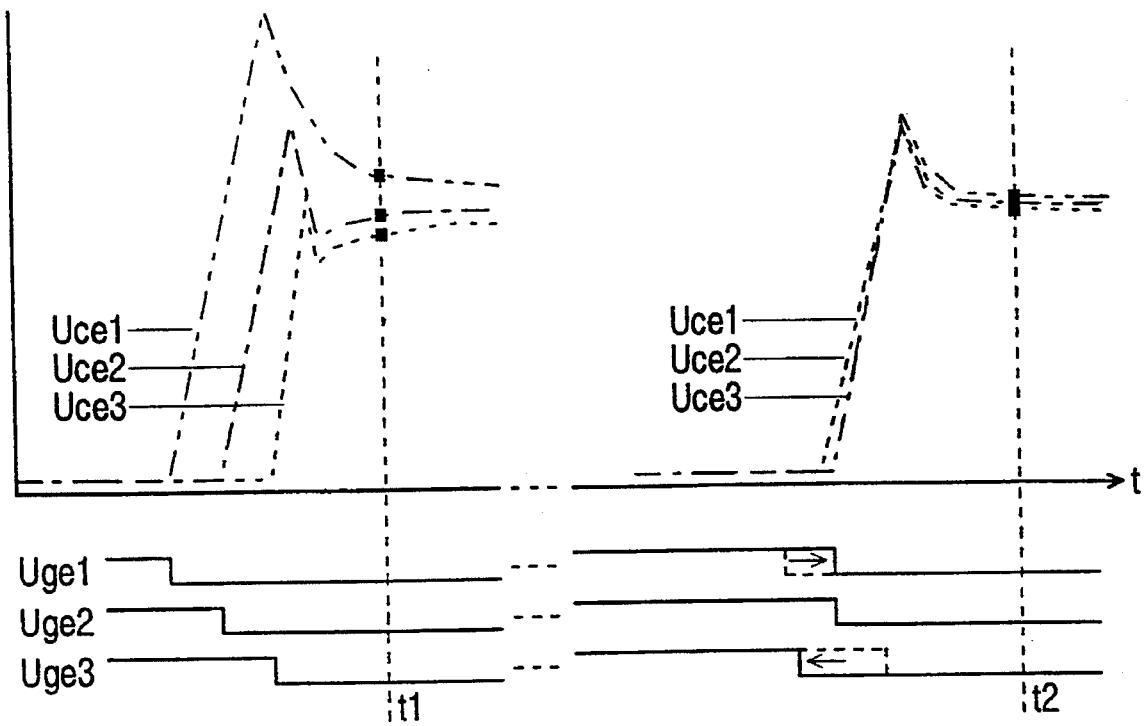
FIG. 9 shows the principle of the balancing control during turn-off.

The procedure is analogous during turn-off (FIG. 9), except that in the case of a negative difference (voltage too high) turn-off is later at the next turn-off (for example, Uge1) and earlier in the case of a positive difference (for example, Uge3). It holds here, as well, that turn-off is not necessarily simultaneous, but at those instants at which the voltage distribution is uniform.

The control is a sampled control, that is to say voltage detection during a specific switching operation (for example, 1 Ucemi (t1)), no control action until one switching operation later (for example, t2). As a result, parameter fluctuations during operation can be adaptively balanced. In addition, there is sufficient time between two switching operations to carry out the required operations.

In the steady state (blocking, P4), another manipulated variable is used. Here, the naturally different and drift-affected leakage currents of the individual switches and the influences of their circuits must be adjusted to one another in such a way as to produce a symmetrical voltage distribution.

IGBTs and MOSFETs behave like voltage-controlled current sources when in an unsaturated steady state. As a result, the blocking current can be specifically increased by means of a turn-off control voltage near the threshold voltage of the semiconductor. Increasing the blocking current decreases the voltage of the individual semiconductor in the series circuit. As a result, the blocking voltage can be continuously corrected for each switch by influencing the level of the turn-off control voltage (Ugeoff1,n).

Figure 10:
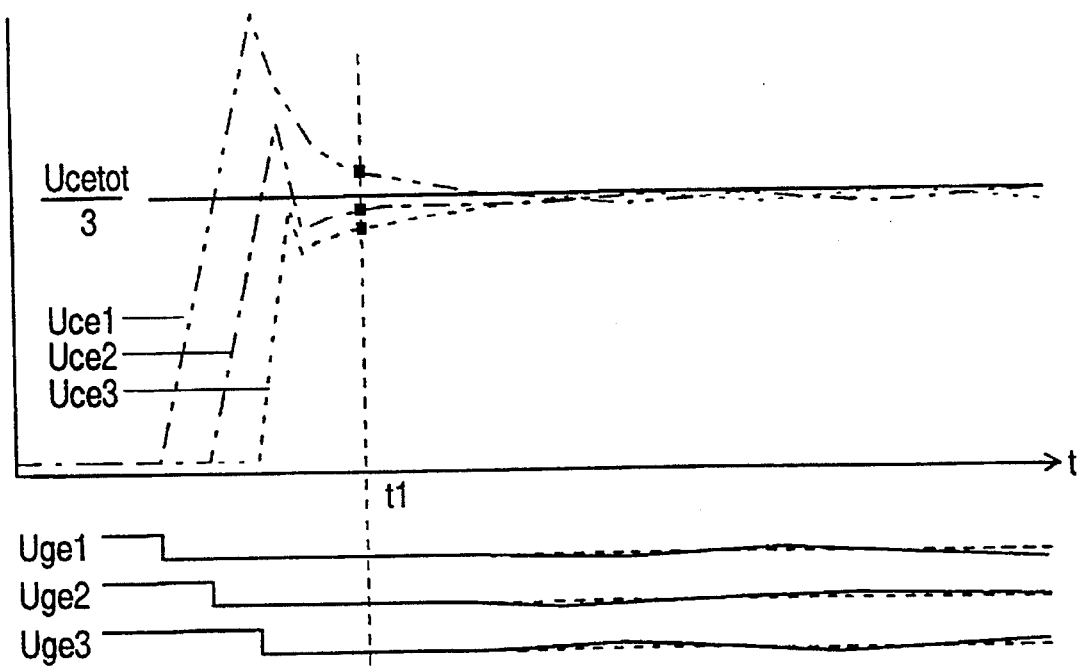
FIG. 10 shows the principle of the balancing control during blocking.

For this purpose, the difference is formed between the nth part of the total voltage (Ucetot) applied across the series circuit and the measured voltage across the switch (Uce1,n). In accordance with this difference, the level of the turn-off control voltages (Ugeoff1,n) is determined in such a way that a balanced voltage distribution results (FIG. 10). The measurement of the switch voltages (Uce1,n) and the subtraction can be performed either continuously or (as in the case of turn-on/off) in a time-discrete fashion.

Since the system is overdetermined in terms of control when the steady-state and transient balancing control is applied to all the individual switches, and this could possibly cause the switching instants and the blocking current to run away, it is sensible to treat one of the switches as master and all the others as slave. In this case, the slaves operate in accordance with the balancing principles just described, while the master is operated with prescribed values for the switching instants and the blocking current. An adaptive setting of the master blocking current permits automatic tracking of tolerances and drift.

Figure 3:
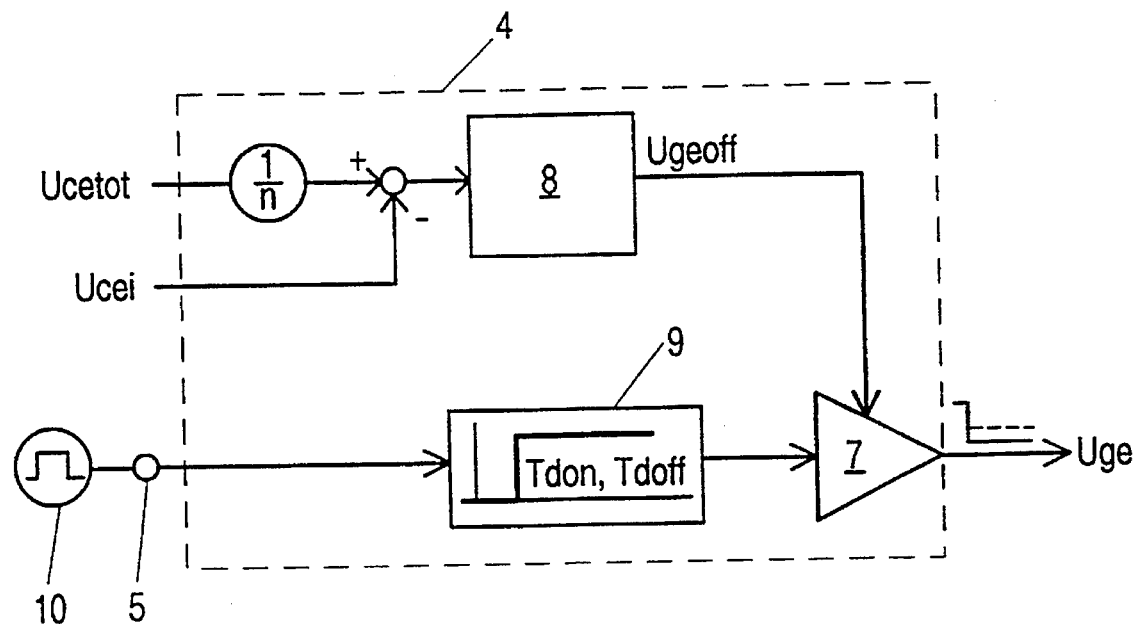
FIG. 3 shows the block diagram of a drive unit according to the invention for one switch, which balances the voltage loading of the switches during blocking.

An electronic power converter circuit arrangement according to the invention comprises (FIGS. 1–3) a series circuit of n, n≧2, power semiconductor switches which can be, for example, a part of a multiphase half-bridge being connected to an intermediate circuit with a DC voltage (Ud). The semiconductor switches can be repeatedly turned on and off at arbitrary instants in a known way by means of a voltage (Uge1 . . . Ugen) applied at the gate (3). For this purpose, a drive unit (4) is provided which is connected to the gates and has a controlled signal input which is connected to an external control signal source (10) and a driver (7), the driver having a signal output (Uge).

In order to be able to carry out the control explained above, the voltage (Uce1 . . . Ucen) across the individual switches and the voltage (Ucetot) across the entire series circuit are measured in the drive unit. A difference (1/nUcetot - Ucei) is formed in each case from these two voltages (Ucei, Ucetot) and relayed to first means (6) in which the switching instants (Tdon, Tdoff) for each switch are determined as set forth above. Furthermore, the first means (6) are connected to a time-delay circuit (9) in which the switching instants of the control signal are set. The output of the time-delay circuit is connected to the driver (7), which for its part applies the control voltage (Ugei) to the gate (3) of the switches.

Thus, the first means (6) and the time-delay circuit (9) can be used to influence the control signals (Uge1 . . . Ugen) in such a way that a balanced voltage distribution results upon switching.

In addition, second means (8) are provided in the drive unit (4) which with the aid of the calculated difference continuously set the level of the control voltage (Ugeoff1,n) in the blocked state (P4) in such a way that each switch is essentially equally loaded in terms of voltage. These second means are connected to the driver (7).

Figure 4:
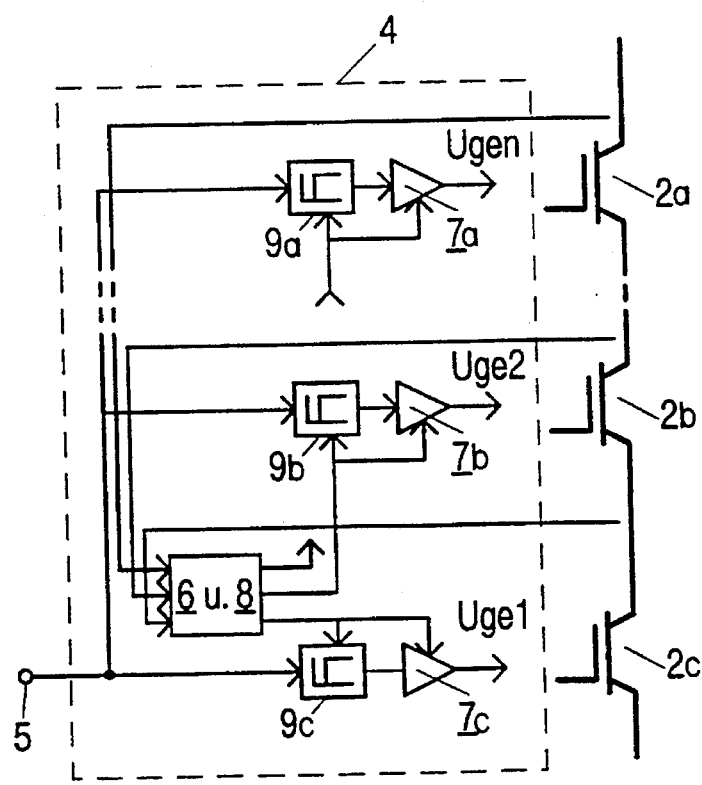
FIG. 4 shows the block diagram of the control unit for a plurality of switches according to a first exemplary embodiment.
Figure 5:
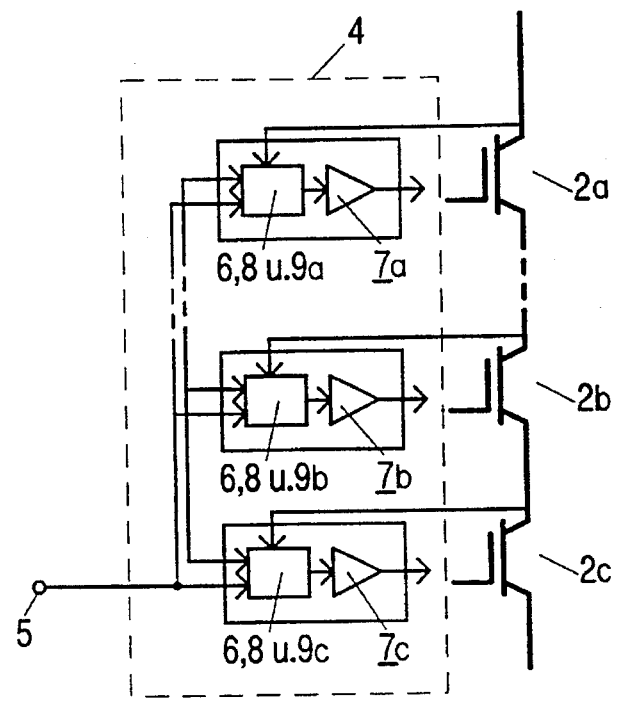
FIG. 5 shows the block diagram of the drive unit for a plurality of switches according to a second exemplary embodiment.

Two preferred exemplary embodiments of the circuit arrangement according to the invention are reproduced in FIGS. 4 and 5. First and second means (6a–c and 8a–c) as well as delay circuits 9a–9c and drivers 7a–7c can be provided locally for each switch in the drive unit (4) (FIG. 5). Another variant consists in that the first and second means (6 and 8) are provided centrally only once and all the drivers (7a–c) and time-delay circuits (9a–c) are driven by these central first and second means (6 and 8) (FIG. 4).

Figure 11A:
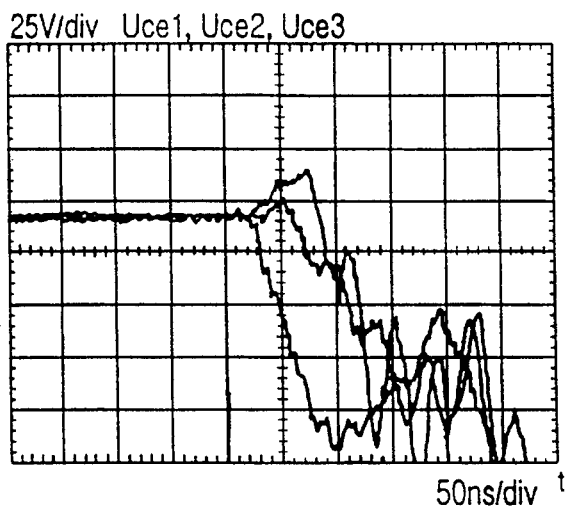
FIGS. 11a–d show measured voltage curves of three switches during turn-on and turn-off with and without control according to the invention.
Figure 11B:
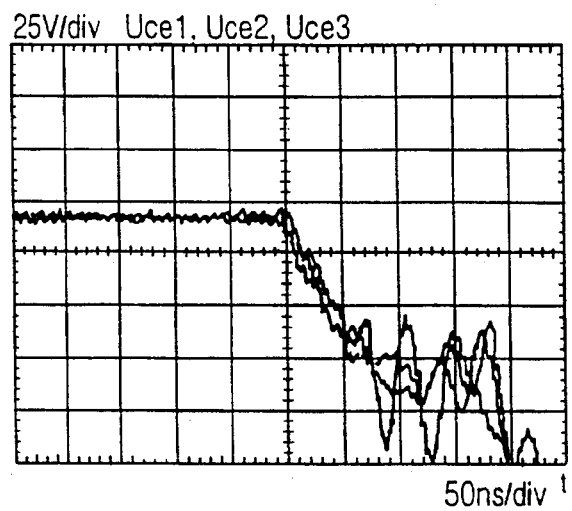
Figure 11C:
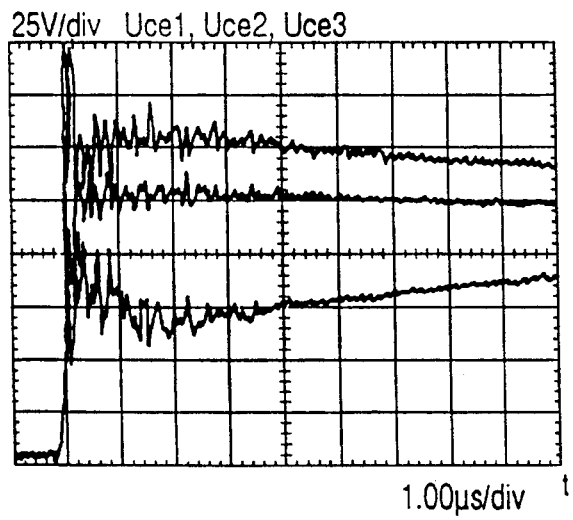
Figure 11D:
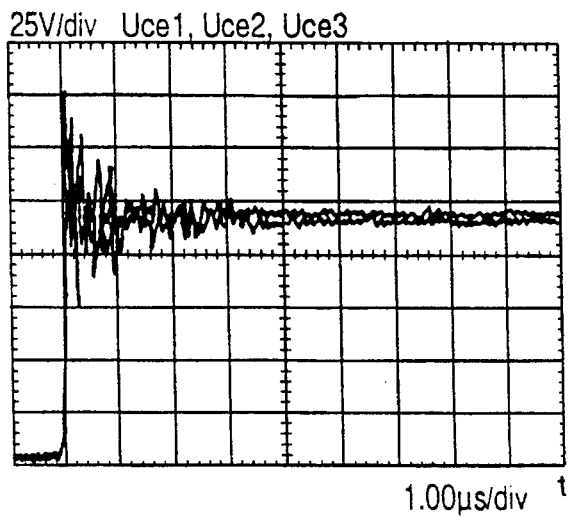

Measurement results of the voltages at three switches are reproduced in FIGS. 11a–d in the case of turn-on (FIGS. 11a and 11b) and in the case of turn-off (FIGS. 11c and 11d). As may be seen, the voltage distribution is clearly better in the case of switching under control (FIGS. 11b and 11d).

Obviously, numerous modifications and variations of the present invention are possible in light of the above teachings. It is therefore to be understood that within the scope of the appendant claims, the invention may be practised otherwise than as specifically described herein.

What is claimed as new and desired to be secured by Letters Patent of the United States is:

1. A method for driving an electronic power converter circuit arrangement,
   a) which circuit arrangement comprises n, n a number greater than two, series-connected power semiconductor switches, the power semiconductor switches each being repeatedly turned on and off via a control voltage, applied to a gate, at arbitrary turn-on and turn-off instants and thus being able to assume the states of "conduction" and "blocking",
   b) in which method a voltage loading of the individual power semiconductor switches is balanced during turn-off by controlling the turn-off instants of the individual power semiconductor switches, wherein
   c) a switch voltage is measured across each switch as controlled variable,
   d) the switching instants of the switches are determined with the aid of the measured voltages in such a way that the voltage loading is essentially balanced for all the switches during switching, and
   e) the level of the control voltage during blocking is calculated for each switch with the aid of the measured voltages in such a way that the voltage loading of the individual switches becomes essentially equal during blocking.

2. The method as claimed in claim 1, wherein
   a) for a specific switching instant during turn-on or turn-off a total voltage applied across the series circuit is formed and divided by the number n of series connected switches, thereby forming the nth part of the total voltage applied across the series circuit;
   b) for a specific switching instant during turn-on or turn-off a difference is calculated from the nth part of the total voltage applied across the series circuit and each of the measured voltages;
   c) in the time between two switching operations, the turn-on or turnoff instants of the control signals of each individual switch are determined from the calculated differences; and
   d) the switch is driven at the next switching instant by means of the calculated control signals.

3. The method as claimed in claim 2, wherein
   a) in the case of turn-on, turn-on is made at a later turn-on instant if the difference is positive, and at an earlier one if the difference is negative, and
   b) in the case of turn-off, turn-off is made at a later turn-off instant if the difference is negative, and at an earlier one if the difference is positive.

4. The method as claimed in claim 1, wherein during blocking
   a) a total voltage applied across the series circuit is formed and divided by the number n of series connected switches, thereby forming the nth part of the total voltage applied across the series circuit;
   b) a difference is formed from the nth part of a total voltage applied across the series circuit and each of the measured voltages;

c) the level of the control voltage is calculated from the differences for each switch.

5. The method as claimed in claim 4, wherein the voltages are increased if the difference is positive and decreased if the difference is negative.

6. The method as claimed in claim 2, wherein a specific switch is operated as master with prescribed values for turn-on and turn-off instants as well as the level of the blocking control voltage, while the values of the remaining switches are determined as in claim 2.

7. An electronic power converter circuit arrangement comprising a) a series circuit of n, a number greater than two, power semiconductor switches which are turned on or off at arbitrary, repeating instants via a control voltage applied to a gate, and can thus assume the states of "conduction" and "blocking"; and b) a drive unit having a control signal input to which a control signal source can be connected, and in which control unit the control signals are generated, and a driver in which the control signals are amplified; wherein c) first means are provided in the drive unit which are connected to the control signal source via a time-delay circuit;

d) in the drive unit, a voltage is measured across each switch and a difference is formed from the nth part of a total voltage measured across the series circuit of the n power semiconductor switches and the measured voltages, it being the case that e) the first means control the turn-on and turn-off instants of the control signals of the individual switches in the time-delay circuit is such a way that all the switches are essentially equally loaded in terms of voltage during turn-on and turn-off-, d) second means are provided in the control unit which are connected to the driver and which during blocking permanently set the level of the control voltages in the blocking state with the aid of the calculated difference in such a way that the voltage loading of the individual switches is essentially equal during blocking.

8. The circuit arrangement as claimed in claim 7, wherein during turn-on and turn-off the measurement of the switch voltage, the subtraction and the calculation of the turn-on/turn-off instants are performed a corresponding state earlier than their application.

9. The circuit arrangement as claimed in claim 8, wherein the drive unit has central first and second means for all the switches, and each switch is decentrally assigned a driver and a time-delay circuit.

10. The circuit arrangement as claimed in claim 9, wherein a driver, a time-delay circuit and first and second means are provided decentrally in the drive unit for each switch.

11. The circuit arrangement as claimed in claim 7, wherein the power semiconductor switches are MOS-controlled switches, in particular MOSFETs or IGBTs.

12. The circuit arrangement as claimed in claim 8, wherein the power semiconductor switches are MOS-controlled switches, in particular MOSFETs or IGBTs.

13. The circuit arrangement as claimed in claim 9, wherein the power semiconductor switches are MOS-controlled switches, in particular MOSFETs or IGBTs.

14. The circuit arrangement as claimed in claim 10, wherein the power semiconductor switches are MOS-controlled switches, in particular MOSFETs or IGBTs.

15. The method as claimed in claim 3, wherein a specific switch is operated as master with prescribed values for turn-on and turn-off instants as well as the level of the blocking control voltage, while the values of the remaining switches are determined as in claim 2.

* * * * *